United States Patent [19]

Baker

[11] 4,322,119

[45] Mar. 30, 1982

[54] CIRCUIT MODULE MOUNTING ASSEMBLY

[75] Inventor: Paul A. Baker, Columbus, Ohio

[73] Assignee: Bell Telephone Laboratories, Incorporated, Murray Hill, N.J.

[21] Appl. No.: 127,508

[22] Filed: Mar. 5, 1980

[51] Int. Cl.³ .............................................. H01R 13/54
[52] U.S. Cl. ............................ 339/17 CF; 339/75 MP
[58] Field of Search .......... 339/17 CF, 75 M, 75 MP, 339/176 M, 176 MP

[56] References Cited

U.S. PATENT DOCUMENTS

| | | | |
|---|---|---|---|
| 3,551,878 | 12/1970 | Rossman | 339/17 CF |
| 3,820,054 | 6/1974 | Clewes et al. | 339/17 |
| 3,825,876 | 7/1974 | Damon et al. | 339/17 |
| 3,997,227 | 12/1976 | Cutchaw | 339/17 |
| 4,054,347 | 10/1977 | Mouissie | 339/75 |
| 4,155,615 | 5/1979 | Zimmerman, Jr. et al. | 339/17 CF |
| 4,252,390 | 2/1981 | Bowling | 339/17 CF |

FOREIGN PATENT DOCUMENTS 47-25547  7/1972  Japan ............................... 339/17 CF Primary Examiner—Joseph H. McGlynn
Attorney, Agent, or Firm—D. A. Marshall

[57] ABSTRACT

Apparatus for mounting a circuit module on a circuit board. The mounting apparatus comprises an insulating base member (10,20) mounting electrical conducting members (102,202) each having a portion (1020,2022) positioned in a plane along side of and parallel to an edge of the base member for contacting a circuit module terminal. A spring housing member (11,21) having a pair of inwardly formed side walls (110,2,10) is provided to spring clamp the circuit module onto the base member and maintain each circuit module terminal in electrical engagement with the contacting surface of a corresponding one of the base mounted conducting members.

10 Claims, 5 Drawing Figures

CIRCUIT MODULE MOUNTING ASSEMBLY

TECHNICAL FIELD

This invention relates to apparatus for mounting modules on printed wiring circuit boards. In particular, it relates to an assembly for use in mounting an integrated circuit module such as a dual in-line package on a printed wiring circuit board.

BACKGROUND ART

Integrated circuit modules often times called dual in-line packages or DIPs, contain a variety of miniaturized electrical circuitry and are widely used on printed wiring circuit boards manufactured by the Electronics and Communications Industry to form larger composite electrical circuits. A typical circuit module is a small modular package containing electrical circuitry that is coupled to metallic conducting leads extending outwardly from opposite longitudinal sides of the modular package. The conducting leads, hereinafter referred to as terminals, generally extend outwardly for a relatively short distance from the modular package and are formed downward at right angles to establish two aligned opposing rows of elongated terminals. Each circuit module terminal is relatively thin and flexible and may be easily damaged during the manufacturing process of assembling circuit modules on printed wiring circuit boards.

Circuit modules are sometimes assembled on printed wiring circuit boards, hereinafter referred to as circuit boards, by inserting the two aligned rows of circuit module terminals into holes formed on a circuit board and soldering the terminals to the board circuitry. The soldering of the terminals to the circuit board makes it difficult to remove and replace defective circuit modules.

Apparatus has been developed for use with circuit boards to facilitate the installation and removal of circuit modules. For example, the circuit module may be rigidly attached to a complementary cartridge in order that both the circuit module and cartridge may be inserted within a row of structured vertical spring terminals previously mounted on the circuit board. Several problems occur in that a cartridge is required to be attached to each circuit module and the fragile vertical spring terminals may be damaged before the circuit module and attached cartridge can be mounted on a circuit board.

Socket devices are often used to position and mount circuit modules on circuit boards. Many such socket devices generally employ an insulative body having a plurality of apertures formed therein each of which contains a spring contact receptacle. Each spring contact receptacle has a tail section that extends through the insulative body and which is soldered to the circuitry of a circuit board. The circuit module is mounted onto the circuit board by forcibly inserting the terminals into the socket apertures to expand or deflect the spring contacts to grasp the terminals and couple them to the circuit board. One of the problems with this type of socket is that a relatively high insertion force is required to plug the circuit module into the socket spring contact receptacles thereby often causing damage to the thin and flexible terminals of the circuit module.

Special sockets, sometimes referred to as zero insertion force sockets, have been developed for use in mounting circuit modules on circuit boards. Zero insertion force sockets are arranged so that the socket contacts by themselves exert little force on the circuit module terminals as the circuit module is inserted into the socket. Once the circuit module has been plugged into the socket, movable contact pressure inducing means are operated to exert a force to engage the circuit module terminals with the socket contacts.

In one type of zero insertion force socket a slide or cam must be operated from one end of the socket to cause the socket to force engagement of the circuit module terminals with the socket contacts. In another type of zero insertion force socket hinged side walls must be swung out from the socket to mount a circuit module on the socket. After mounting the circuit module the hinged socket side walls must be swung back and locked into position to engage the terminals with the socket contacts.

Manufacturing packaging techniques presently in common use require that circuit module sockets be mounted on a circuit board in high density arrays of sockets. A problem arises with the aforementioned zero insertion force sockets in that the density of circuit module sockets on a circuit board make it difficult to position slides, cams and hinged side walls of sockets so that circuit modules may be inserted in or removed from the sockets. In addition, the inconvenience of operating socket slides, cams and hinged side walls of sockets densely mounted on circuit boards makes it difficult to use mechanized means to insert circuit modules into circuit board sockets.

Accordingly, a need exists in the art for apparatus arranged to mount circuit modules in high density arrays on a circuit board. A need also exists for apparatus arranged to receive and mount a circuit module on a circuit board without damaging the circuit module terminals and without the necessity of operating the mounting apparatus to first open contacts to relieve the high insertion force and then close the contacts to engage the module terminals.

SUMMARY OF THE INVENTION

The foregoing problems are solved and a technical advance is achieved by apparatus arranged for use in spring mounting a circuit module on a circuit board and for use in interconnecting the terminals thereof with circuitry of the circuit board. The mounting apparatus comprises an assembly for holding the module and includes an insulating base member mounting electrical conducting members each having one portion for engaging the circuit board and another portion configured to form a surface for contacting a module terminal in a plane parallel to an edge of the base member. A housing member of the assembly is provided to spring clamp the module onto the base member and to maintain each terminal of the module in electrical engagement with the contacting surface of a corresponding one of the base mounted electrical conducting members.

In accordance with the invention an assembly for use in holding a module and interconnecting terminals thereof with a circuit board comprises a base member formed of electrically insulative material into a generally rectangular body having a pair of vertical end sections arranged to support the module. The base member also comprises an elongated channel longitudinally formed along each side edge and a plurality of indents formed into each side edge perpendicular to the channel for enabling a housing member to spring clamp the module onto the base member and maintain each module terminal in electrical engagement with a corresponding base mounted electrical conducting member having a contacting surface positioned in an indent.

Also in accordance with the invention an assembly for use in mounting an integrated circuit module on a circuit board comprises a housing member having a pair of inwardly formed side walls each having an insulated bar attached thereto and which is positioned over the module and a supporting base member to spring clamp the module onto the base member and maintain each terminal of the module in electrical engagement with a corresponding base mounted contact member.

Also in accordance with the invention an assembly for use in mounting an integrated circuit module on a circuit board and interconnecting the terminals thereof with the circuit board comprises a plurality of electrically conducting members mounted on an insulating base to extend perpendicularly from top and bottom surfaces of the base. Each electrically conducting member comprises one portion for engaging the circuit board and another portion configured to extend outwardly in a U-shaped configuration over the base top surface to form a surface for contacting a module terminal in a plane formed at a dihedral angle with a side edge of the base.

In further accordance with the invention an assembly for use in mounting an integrated circuit module on a circuit board and for interconnecting the terminals thereof with the circuit board comprises a plurality of contact members mounted on an insulating base member in two spaced parallel opposed rows extending perpendicularly from top and bottom surfaces of the base member. Each contact member comprises a first portion for engaging the circuit board and another portion fabricated to extend outwardly in a U-shaped configuration over the base member top surface to form a surface for contacting a module terminal in a plane parallel to one edge of the base member. The contact member is extended outward and downward at right angles, respectively, from the module terminal contacting section to form a second portion for engaging the circuit board.

DESCRIPTION OF THE DRAWING

The foregoing as well as other objects, features and advantages of the invention will be more apparent from a description of the drawing in which.

DESCRIPTION OF THE INVENTION

1. Apparatus Description

Figure 1:
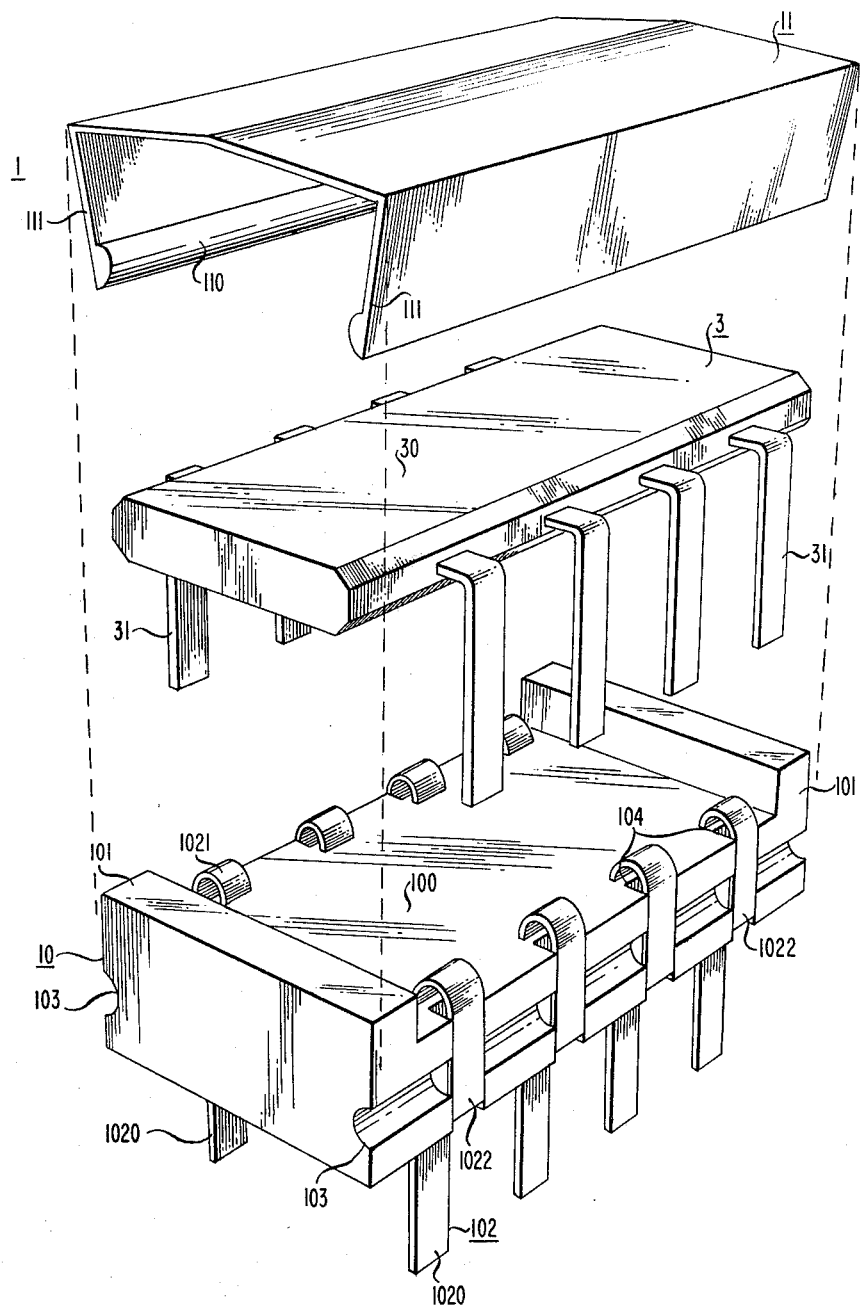
FIG. 1 is a perspective view showing assembly of exemplary circuit module mounting apparatus embodying the principles of the instant invention.

Referring to the drawing and more specifically to FIG. 1 of the drawing, apparatus 1 shown therein is intended for use in mounting a module 3 on a circuit board. Module 3 is an integrated circuit module commonly referred to as a dual in-line circuit package (DIP) and is designed to contain a wide variety of miniaturized electrical circuitry coupled to terminals 31 that protude from an insulating housing 30 wherein is located the circuitry.

Apparatus 1 comprises an assembly having a base member 10 arranged to support circuit module 3 and interconnect terminals 31 with the circuitry of a circuit board. Base member 10 is constructed of an electrical insulating material, such as polyphenylene sulfide, formed into a generally rectangular body 100 having a pair of vertical end sections 101 intended to receive and support circuit module 3. Each side edge of base member 10 has an elongated channel 103 of a generally U-shaped cross-section longitudinally formed therein along a line parallel to the top and bottom surfaces of base member 10. In addition to channel 103, a plurality of indents 104 corresponding in number to the number of module terminals 31 are formed into each side edge of base member 10 perpendicular to channel 103.

The mounting assembly also comprises a plurality of electrically conducting members 102 mounted on base member 10 in two spaced apart parallel rows of opposed contact members. Electrically conducting members 102, hereinafter referred to as contact members, are formed from a electrically conducting material such as a copper alloy and are intended for use in interconnecting terminals 31 of circuit module 3 with the circuitry of a circuit board.

Each contact member 102 is mounted so that portions thereof extend perpendicularly from top and bottom surfaces of base member 10. A lower or bottom portion 1020 of a contact member 102 extending from the bottom surface of base member 10 is provided to form a first contacting section that may be soldered or similarly attached to a circuit board to both anchor base member 10 to the circuit board and to electrically interconnect a module terminal 31 with circuitry of the circuit board. A top portion 1021 of a contact member 102 is configured to extend outwardly in a generally U-shaped configuration over an edge of the top surface of base member 10 and is positioned in a base member indent 104 to form a contacting surface 1022 in a plane parallel to an edge of base member 10 for engaging a corresponding module terminal 31.

The mounting assembly also includes a gentle peaked roof spring housing member 11 having a pair of inwardly formed side walls 111 each with an insulator bar 110 attached along the free end thereof.

Figure 4:
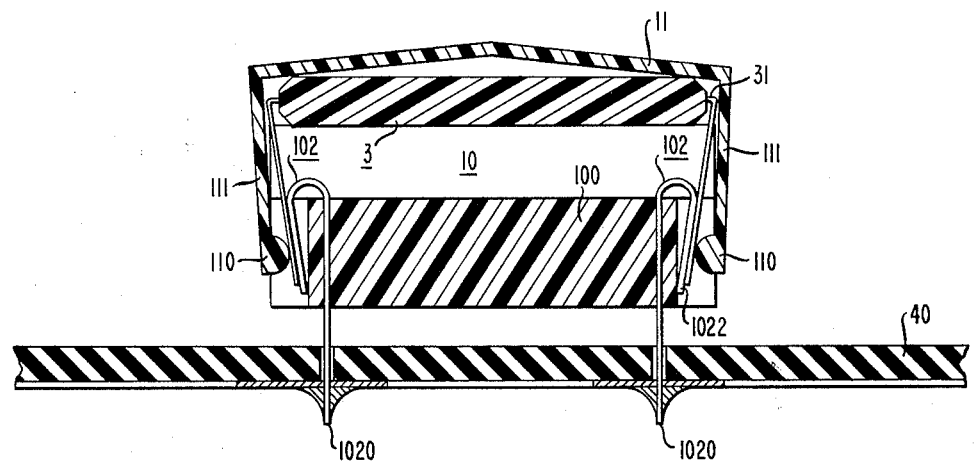
FIG. 4 is a cross-sectional view of the assembled circuit module mounting apparatus set forth in FIG. 1.

Base member 10, FIG. 4 of the drawing, is installed on a circuit board 40 by inserting the bottom portion 1020 of contact members 102 into holes located on circuit board 40 and soldering them to the circuitry thereon. Circuit module 3 is then placed on base member 10 and supported by the base member vertical end sections 101, FIG. 1, so that each circuit module terminal 31 corresponds to and mates with a contacting surface 1022 of one of the base member contact members 102.

Figure 2:
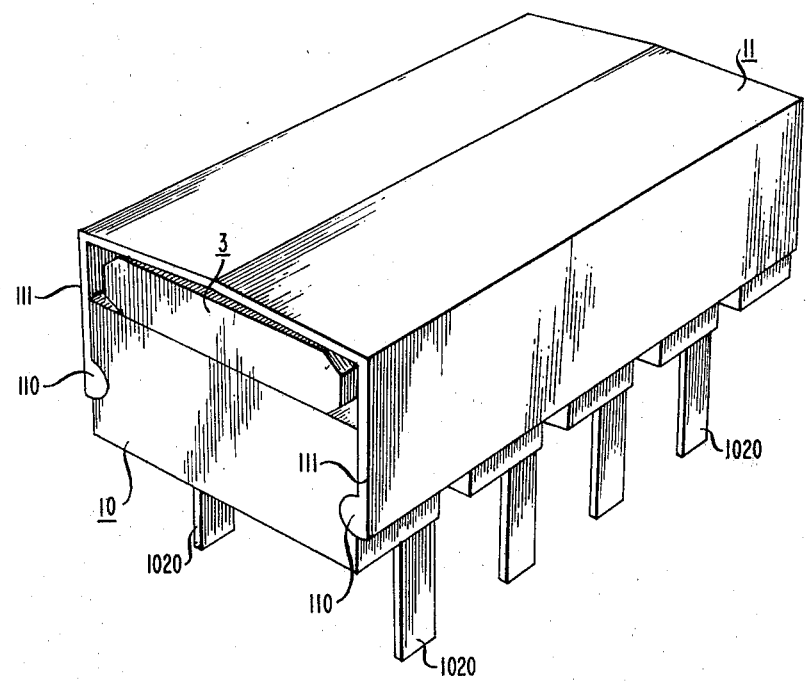
FIG. 2 is a perspective view showing the assembled circuit module mounting apparatus.

Spring housing member 11 is then positioned and forced downward over both circuit module 3 and base member 10 until the housing side wall insulating bars 110 engage the elongated channels 103 of base member 10. As set forth in FIG. 2 of the drawing, housing member 11 spring clamps circuit module 3 onto base member 10 and provides a shroud to protect both circuit module 3 and base member 10. The inwardly formed side walls 111 generate sufficient force to enable insulator bars 110, FIG. 4 of the drawing, to maintain each circuit module terminal 31 in electrical engagement with a gas tight connection to the contacting section 1022 of a corresponding contact member 102. Contacting section 1022 may be plated with gold or other materials to improve both the electrical and wear characteristics of contact member 102.

Figure 3:
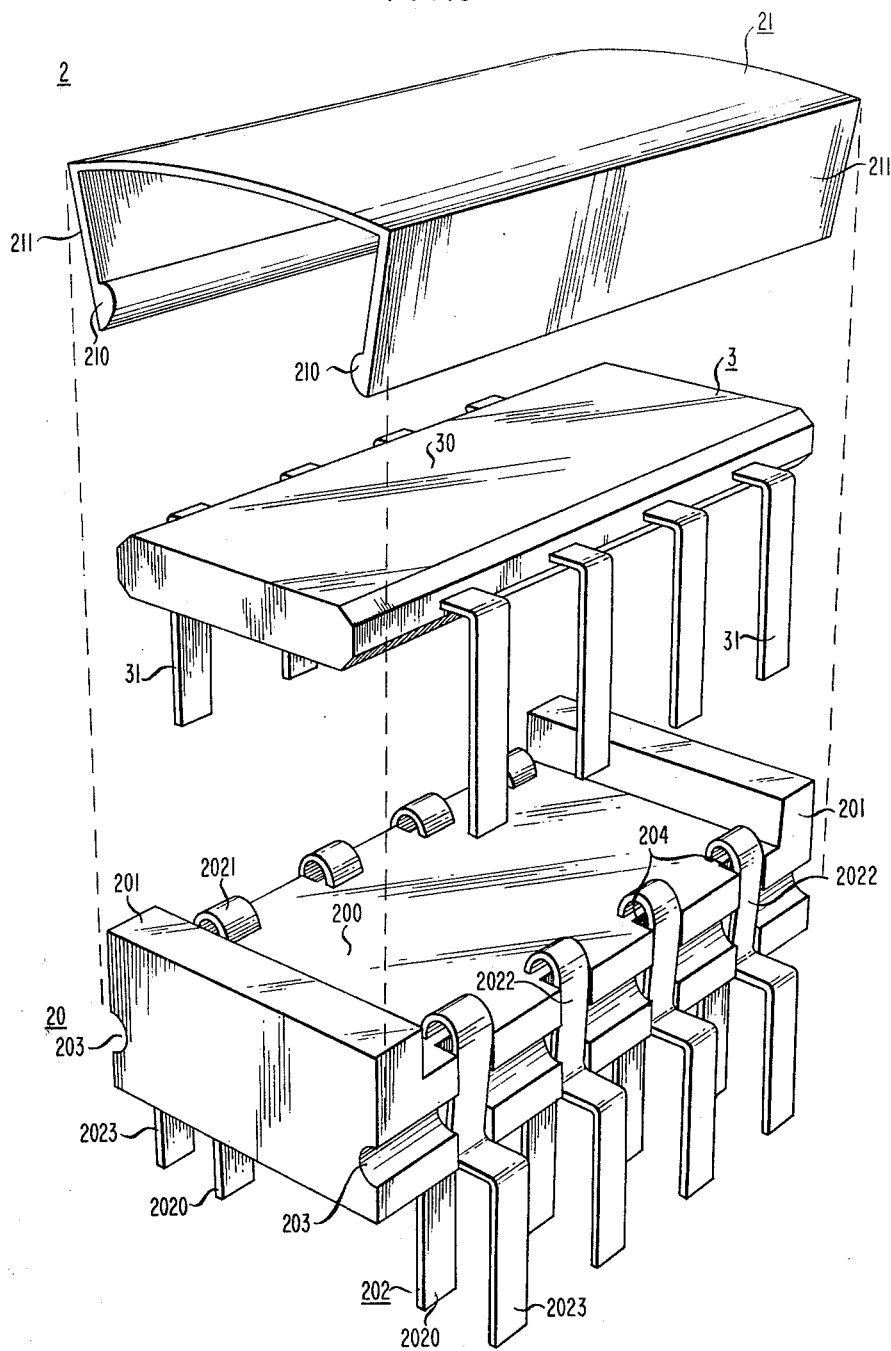
FIG. 3 is a perspective view illustrating an assembly of circuit module mounting apparatus in accordance with another embodiment of the invention.
Figure 5:
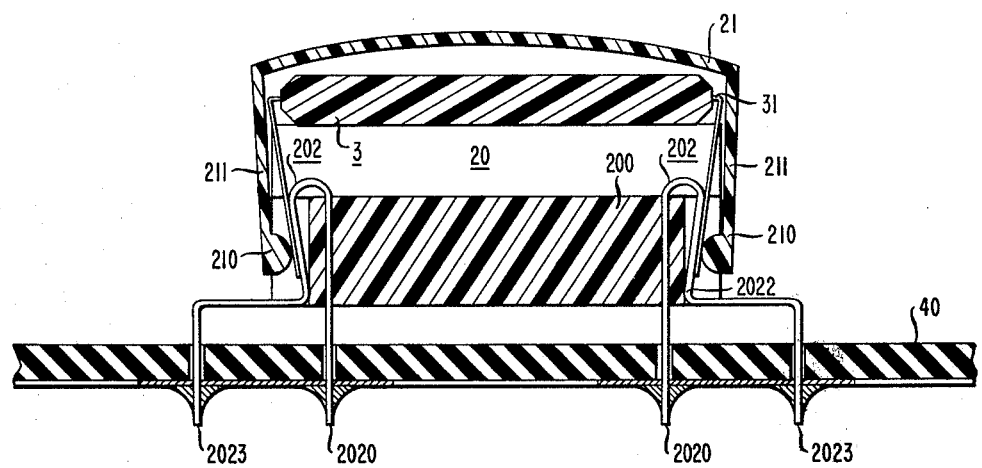
FIG. 5 is a cross-sectional view of the assembled circuit module mounting apparatus set forth in FIG. 3.

In accordance with another embodiment of the invention as set forth in FIGS. 3 and 5 of the drawing, an insulating base member 20 is formed to receive and support circuit module 3 on a pair of vertical end sections 201. A plurality of contact members 202, corresponding in number to the number of circuit module terminals 31, are perpendicularly mounted in two parallel rows along the edges of base member 20. Each contact member 202 comprises a first portion 2020 extending downward from the bottom surface of base member 20 for use in engaging a circuit board. A top portion 2021 is fabricated to extend outwardly in a U-shaped configuration over the top surface of base member 20 to form a contacting section 2022 positioned in a base member indent 204 at a dihedral angle with a side edge of base member 20. Contact member 202 is then extended outwardly and downwardly at right angles, respectively, from base member 20 to form a second portion 2023 used to engage the circuit board. The use of first and second portions 2020, 2023 of contact member 202 to engage the circuit board provides a stronger contact structure to enable base member 20 to be more securely anchored to the circuit board and to strengthen contacting section 2022.

In assembly, circuit module 3 is positioned on base member 20 and supported by vertical end sections 201 so that each circuit module terminal 31 is adjacent to contacting section 2022 of a corresponding contact member 202. Spring housing member 21 having a curved roof with inwardly formed side walls 211 is forced downward over both base member 20 and circuit module 3 to engage the side wall insulated bars 210 with elongated channels 203 longitudinally formed in the sides of base member 20.

As set forth in FIG. 5 of the drawing spring housing member 21 spring clamps circuit module 3 onto base member 20 and maintains each circuit module terminal 31 in a gas tight electrical engagement with contacting section 2022 of a corresponding contact member 202. Electrical connections exist between the circuitry of circuit module 3 over circuit module terminals 31 through engaged contacting sections 2022 and the first and second portions 2020, 2023 of contact member 202 with the circuitry of circuit board 40.

In some microprocessor and other applications it is necessary to connect a pair of circuit modules 3 in parallel wherein one circuit module 3 is directly placed on top another circuit module 3 such that each terminal 31 of the top circuit module 3 directly overlies a corresponding terminal 31 of the lower circuit module 3. Both circuit modules 31 may be mounted on base member 20 and a spring housing 21 having slightly longer side walls 211 used to clamp both circuit modules 31 onto base member 20. In addition to clamping both circuit modules 31 onto base member 20 spring housing 21 maintains each pair of circuit module terminals 31 in electrical engagement with contacting section 2022 of a corresponding contact member 202.

Circuit module 3 may easily be removed from a base mounting 10, 20 by exerting a slight downward force on the top surface of the spring housing 11, 21 to disengage insulator bars 110, 210 from base member channels 103, 203. Spring housing 11, 21 and circuit module 3 may then be easily removed from the circuit board.

SUMMARY

It is obvious from the foregoing that the facility, economy, and efficiency of mounting circuit modules on circuit boards may be substantially enhanced by mounting apparatus arranged to spring clamp a circuit module onto a circuit board and maintain an electrical engagement of the module terminals with the circuitry of the circuit board. It is further obvious that circuit module mounting apparatus having a housing member arranged to both spring clamp a circuit module onto a base member and maintain the circuit module terminals in electrical engagement with base member contact members coupled with a circuit board facilitates the mechanization of installing circuit modules on circuit boards and alleviates the need for socket and mechanically operated zero insertion types of circuit module mountings.

What is claimed is:

1. Apparatus for mounting a module (3) having terminals (31) on a circuit board (40), said apparatus comprising
    an assembly (1) for holding the module and interconnecting the terminals thereof with the circuit board characterized in that
    said assembly comprises
    an insulating base member (10) mounting electrical conducting members (102) each having one portion (1020) for engaging the circuit board and another portion (1021) configured to extend in a U-shaped configuration over the base member top surface to form a surface (1022) for contacting a module terminal in a plane parallel to an edge of said base member, and
    housing means (11) for spring clamping the module onto said base member and for maintaining each module terminal in electrical engagement with said contacting surface of a corresponding one of said electrical conducting members.
2. The module mounting apparatus of claim 1 characterized in that
    said insulating base member comprises contact members (102) mounted on said insulating base member in two spaced parallel opposed rows extending perpendicularly from top and bottom surfaces of said insulating base member, each of said contact members having one portion (1020) for engaging the circuit board and another portion (1021) configured to extend outwardly in a U-shaped configuration over the base member top surface to form a contacting section (1022) positioned in a plane formed parallel with a side edge of said base member.
3. The module mounting apparatus of claim 1 characterized in that
    said insulating base member comprises contact members (202) mounted on said insulating base member in two spaced parallel opposed rows extending perpendicularly from top and bottom surfaces of said insulating base member, each of said contact members having a first portion (2020) for engaging the circuit board and another portion (2021) first configured to extend outwardly in a U-shaped configuration over the base member top surface to form a contacting section (2022) at a dihedral angle with one edge of said base member and then extended outward and downward at right angles respectively to form a second portion (2023) for engaging the circuit board.

4. The module mounting apparatus of claim 2 or claim 3
characterized in that
said housing means comprises
a spring housing member (11,21) having a pair of inwardly formed side walls (111,211) disposed for clamping the module onto said insulating base member and for maintaining each module terminal in electrical engagement with said contacting section of a corresponding one of said contact members.

5. The module mounting apparatus of claim 4
characterized in that
said insulating base member (10,20) comprises insulative material formed into a generally rectangular body (100,200) having vertical end sections (101,201) for supporting the module.

6. The module mounting apparatus of claim 5
characterized in that
said module supporting body (10,20) comprises an elongated channel (103,203) formed along each side edge of said supporting body and a plurality of indents (104,204) formed into each side edge prependicular to said channel for receiving said contacting sections of corresponding ones of said contact members.

7. The module mounting apparatus of claim 6
characterized in that
said spring housing member side walls (111,211) each comprise insulator means (110,210) for engaging said supporting body elongated U-shaped channel to clamp the module onto said supporting body and maintain each module terminal in electrical engagement with said corresponding contact member contacting section.

8. Apparatus for mounting an integrated circuit module (3) having terminals (31) on a circuit board (40), said apparatus comprising
an assembly (1,2) for holding the integrated circuit module and interconnecting the terminals thereof with the circuit board
characterized in that
said assembly comprises
an insulating base member (10,20) for supporting the integrated circuit module and having two spaced parallel rows of mounted contact members (102,202) extending perpendicularly from top and bottom surfaces of said base member, each of said contact members having a bottom portion (1020,2020,2023) for engaging the circuit board and a top portion (1021,2021) configured to extend outwardly in a U-shaped configuration over the base member top surface to form a contact surface (1022,2022) positioned in a plane parallel to a side edge of said base member; and
housing means (11,21) having a pair of inwardly formed side walls (111,211) disposed for spring clamping the integrated circuit module onto said insulating base member and for maintaining each integrated circuit module terminal in electrical engagement with said contacting surface of a corresponding one of said contact members.

9. Apparatus for mounting an integrated circuit module (3) having terminals (31) on a circuit board (40), said apparatus comprising
an assembly (1,2) for holding the integrated circuit module and interconnecting the terminals thereof with the circuit board
characterized in that
said assembly comprises
a base member (10,20) formed of electrically insulative material into a generally rectangular body (100,200) having a pair of vertical end sections (101,201) for supporting the circuit module, said base member having an elongated channel (103,203) of a generally U-shaped cross-section formed along each side edge thereof and having a plurality of indents (104,204) formed into each side edge perpendicular to said channel;
a plurality of contact members (102,202) mounted in said base member in two spaced parallel rows extending perpendicularly from top and bottom surfaces of said base member, each of said contact members having a bottom contacting section (1020,2020,2023) for engaging the circuit board and a top portion (1021,2021) configured to extend outwardly in a U-shaped configuration over the base member top surface and positioned in one of said base member indents to form an upper contacting surface (1022,2022) for engaging one of the integrated circuit module terminals; and
a spring housing member (11,21) having a pair of inwardly formed side walls (111,211) with an insulator bar (110,210) attached thereto to engage said base member U-shaped channel for clamping the integrated circuit module onto said base member and for maintaining each integrated circuit module terminal in electrical engagement with said upper contacting section of a corresponding one of said contact members.

10. Apparatus for mounting an integrated circuit module on a circuit board and interconnecting the terminals thereof with the circuit board comprising
a base member formed of electrical insulative material into a generally rectangular body having a pair of vertical end sections for supporting the integrated circuit module;
a plurality of contact members mounted on said base member in two spaced parallel rows for interconnecting the integrated circuit module terminals with the circuit board, each of said contact members having one portion for engaging the circuit board and another portion configured to extend outwardly in a U-shaped configuration over the top surface of said base member to form a contacting section for engaging one of the integrated circuit module terminals in a plane parallel to an edge of said base member; and
a spring housing member having a pair of inwardly formed side walls disposed for clamping the integrated circuit module onto said base member and for maintaining each terminal thereof in electrical engagement with said contacting section of a corresponding one of said contact members.

* * * * *